(12) United States Patent
Schmatz et al.

(10) Patent No.: US 8,576,106 B2
(45) Date of Patent: Nov. 5, 2013

(54) ANALOG-DIGITAL CONVERTER

(75) Inventors: Martin Leo Schmatz, Rueschlikon (CH); Thomas H. Toifl, Rueschlikon (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/306,650

(22) Filed: Nov. 29, 2011

(65) Prior Publication Data

US 2012/0133541 A1    May 31, 2012

(30) Foreign Application Priority Data

Nov. 30, 2010 (EP) .................................. 10193054

(51) Int. Cl.
*H03M 1/12* (2006.01)

(52) U.S. Cl.
USPC ............ 341/172; 341/118; 341/120; 341/155

(58) Field of Classification Search
USPC .................................. 341/118, 120, 155, 172
See application file for complete search history.

(56) References Cited

U.S. PATENT DOCUMENTS

| | | | | |
|---|---|---|---|---|
| 5,621,409 A * | 4/1997 | Cotter et al. | .................. | 341/156 |
| 6,433,724 B1 * | 8/2002 | Confalonieri et al. | ........ | 341/155 |
| 6,563,449 B2 * | 5/2003 | Takata et al. | .................. | 341/172 |
| 7,898,453 B2 * | 3/2011 | Mathe | ........................... | 341/172 |
| 7,944,387 B2 * | 5/2011 | Ohnhaeuser et al. | ......... | 341/172 |
| 8,159,382 B2 * | 4/2012 | Srinivasa et al. | ............... | 341/156 |
| 2004/0257256 A1 * | 12/2004 | Leung et al. | ................ | 341/172 |
| 2007/0229340 A1 * | 10/2007 | Krishnamoorthi et al. | ... | 341/155 |
| 2010/0026546 A1 * | 2/2010 | Ohnhaeuser et al. | ......... | 341/172 |
| 2012/0154194 A1 * | 6/2012 | Chang et al. | .................. | 341/158 |

\* cited by examiner

*Primary Examiner* — Linh Nguyen

(74) *Attorney, Agent, or Firm* — Gail Zarick, Esq.; McGinn IP Law Group, PLLC

(57) ABSTRACT

An analog-digital converter includes converter units and a control unit. The converter units each including a comparator for performing a comparison using an input voltage, one or more capacitor ladders each having a signal line connected with first terminals of capacitors and with one input of the comparator, and switches each of which is associated with one of the capacitors, connected to a second terminal of the respective capacitor with a first or a second reference potential, the input voltage being shifted when switching one or more of the switches. The control unit controls the number of converter units, and to set the switching states of the plurality of switches in conversion cycles and to obtain comparison results from each of the comparators in a comparison subsequent to each setting of the switching states.

18 Claims, 3 Drawing Sheets

ANALOG-DIGITAL CONVERTER

CROSS REFERENCE TO RELATED APPLICATIONS

The present application claims priority, makes reference to, incorporates the same herein, and claims all benefits accruing under 35 U.S.C. §119 from an application for ANALOG-DIGITAL-CONVERTER, earlier filed in the European Patent Office on 30 Nov. 2010 and there duly assigned European Patent Application No. 10193054.3, the entire disclosure of which is hereby incorporated by reference in its entirety.

BACKGROUND OF THE INVENTION

1. Field of the Invention

The disclosed invention relates to analog-digital converters, in particular to SAR converters (SAR: Successive Approximation Register). Furthermore, the disclosed invention relates to SAR converter topologies which provide redundancy by using 1.5 bit conversion steps.

2. Description of the Related Art

SAR converters for analog-digital conversion are well known in the art. In particular, SAR converters are frequently used in integrated CMOS devices since they provide a reasonable resolution and conversion time and can be implemented by optimally utilizing the advantages of the CMOS technology, which are small-sized CMOS-switches and capacitors having well-defined relative capacitance.

SAR converters generally include at least one capacitor bank with capacitors of different values, usually with a relation between their capacitance values by a factor of $2^n$ (n: integer). Each capacitor is connected between the signal line and a ground potential and is further associated with a switch so that the capacitor can be disconnected from the ground potential and connected to a reference voltage. In a sampling phase, a voltage level of an input signal applied on the signal line is stored on each capacitor of the capacitor bank. In a following second phase, a reference voltage is applied successively to ground plates of the capacitors and the resulting voltage on the signal line is compared with the reference voltage level. After a connection of the ground plate of a capacitor with the reference voltage is made, the result bit of the comparison is stored in a register. Furthermore, the result bit determines the final state of the switch previously set so that a further switching of the previously set switch may be carried out after the result bit of the single comparison has been determined. In other words, the result bits represent the switching states for the most significant capacitors, i.e. the capacitors having the highest capacities. Depending on the result bit of each single comparison step it is decided whether to keep the recently switched capacitor in the last switching position or to return connecting its ground plate with the ground potential again.

Beginning with the most significant bit associated with the capacitor with the highest capacitance, the input signal is sampled by subsequently applying the reference potential to the ground plates of the respective capacitors, followed by a comparison the result of which firstly is stored. Secondly, the result determines whether the ground plate of the capacitor is kept connected with the reference voltage or returned to ground potential. When all of the capacitors have been sampled this way, the stored result bits correspond to a digital representation of a sampled voltage of the input signal.

For conventional SAR converters, the capacitor ladder comprises capacitances of values C, C, 2C, 4C, 8C, ..., $2^n$ C. This kind of binary ladder can be used to obtain a binary result in the register which directly corresponds to the sampled voltage of the input signal as a binary digital value.

Although the above description of a SAR converter relates to a non-differential input signal, the same concept can be applied to differential input signals, wherein two capacitor ladders are connected with the inverting and non-inverting input of the comparator. For each comparison step the potential of both signal lines is shifted simultaneously, and the result of the comparison is stored as a result bit in the respective register.

SAR converters can be provided with redundancy. Redundancy is achieved such that the value range defined by the result bit of the previously performed comparison step is extended for a next comparison so that a conversion result can finally be obtained that is outside the value range defined by one or more of the result bits. Such redundancy can increase the reliability of the ADC considerably because small conversion errors for input values that fall close to a decision threshold of one conversion cycle can be corrected in consecutive conversion steps. Usually, in a converter with a specific resolution the provision of redundancy increases the number of cycles (comparison steps) necessary to perform the full conversion. Thus, increasing the redundancy means increasing the overall conversion time.

Furthermore, the range decision can be altered from a binary to a ternary or even a higher degree (e.g. quaternary) of decisions by parallelizing the comparison steps. In case of a ternary analog-digital conversion, two conversion paths are simultaneously applied, defining a lower and the upper decision threshold level for each single conversion to obtain a trisection of the respective discrimination range. Combining redundancy with a higher degree of decisions (binary, ternary, quaternary etc.) can provide a decent trade-off between a number of overall conversion cycles and the achieved degree of redundancy.

Apart from the number of conversion cycles necessary to perform the full analog-digital conversion result, the reduction of the cycle time for each comparison step is essential in order to keep the overall conversion time low. In case redundancy is obtained by using a higher than binary degree of conversion, the conversion cycle time is substantially increased since the comparison results have to be mapped to a switching scheme for the switches which are associated with the capacitors using a mapping logic. This mapping logic is required to calculate the capacitance values for each individual conversion cycle in a way to achieve a specific redundancy level for this cycle. The signal processing using this mapping logic consumes time in each conversion cycle, so that the overall conversion time is increased by the product of the signal propagation time in the mapping logic and the number of conversion cycles.

SUMMARY OF INVENTION

According to an embodiment of a first aspect an analog-digital converter is provided, including a number of converter units each including a comparator for performing a comparison using an input voltage, one or more capacitor ladders each having a signal line connected with first terminals of a plurality of capacitors and with one input of the comparator, wherein the capacitances of the capacitors are set to provide conversion redundancy, and a plurality of switches each of which is associated with one of the plurality of capacitors, connected to a second terminal of the respective capacitor with a first or a second reference potential, wherein the input voltage is shifted when switching one or more of the switches, a control unit for controlling the number of converter units wherein the control unit is adapted to set the switching states of the plurality of switches in a plurality of conversion cycles and to obtain comparison results from each of the comparators in a comparison step subsequent to each setting of the switching states; wherein the comparison results for each conversion cycle are associated with the switching states of one or more of the plurality of switches, wherein the switching states of the switches are directly controlled by the level of the comparison results for each conversion cycle.

One idea of the above embodied analog-digital converter lies in that the multiple conversion paths which provide a higher than binary degree of conversion combined with capacitor ladders which provide conversion redundancy, provide a number of comparison results in each conversion step, the levels of which can be directly used to determine the switching state of one or more switches. Thereby, the capacitor ground plate levels can be connected with a respective reference potential without using any additional logic, so that no additional signal delay is caused when using a higher than binary conversion degree. In other words, thanks to redundancy, the settling time of the capacitors after each comparison is reduced so that the overall conversion time can be kept low.

Furthermore, the converter may comprise a storage means of storing the comparison results for each conversion cycle, wherein the storage means has outputs for each of the comparison results wherein each output is associated with one or more of the plurality of switches, wherein the switching states of the switches are directly controlled by the levels of the outputs.

Moreover, each of the converter units may include a pair of capacitor ladders so that two signal lines are applied to the comparator at an inverting and non-inverting input thereof.

It can be provided that the control unit is adapted to set each of the switches to an initial state, to load the capacitors by applying the input voltage to the signal line, and to cycle through the conversion cycles wherein the comparison results of each conversion cycle is stored in the storage means.

According to an embodiment, for each of the converter units the plurality of capacitors of the one or more capacitor ladders may be divided into groups of capacitors, wherein each group of capacitors is associated with the comparison results of a comparison of just one conversion cycle.

Furthermore, the number of capacitors in each group may correspond to the number of different comparison results of the comparison step of the respective conversion cycle.

The capacitors of each of the groups of capacitors may be connected to increase or decrease the input voltage applied at the comparator depending on the comparison results of the comparison step of the respective conversion cycle.

Moreover, the capacitors of each of the groups of capacitors may be connected to increase or decrease the input voltage applied at the comparator depending on the comparison results of the comparison step of the respective conversion cycle.

According to an embodiment of a further aspect a method for operating an analog-digital converter is provided, wherein the converter includes a number of converter units each including a comparator for performing a comparison using an input voltage, one or more capacitor ladders each having a signal line connected with first terminals of a plurality of capacitors and with one input of the comparator, and a plurality of switches each of which is associated with one of the plurality of capacitors, connected to a second terminal of the respective capacitor with a first or a second reference potential, wherein the input voltage is shifted when switching one or more of the switches, wherein the method for operating includes setting the switching states of the plurality of switches in a plurality of conversion cycles, obtaining comparison results from each of the comparators in a comparison step subsequent to each setting of the switching states; wherein the comparison results for each conversion cycle are associated with the switching states of one or more of the plurality of switches, and directly controlling the switching states of the one or more of the plurality of switches by the levels of the comparison results of the preceding conversion cycle.

BRIEF DESCRIPTION OF DRAWINGS

Preferred embodiments of the present invention are described in detail in conjunction with the accompanying drawings, in which.

DETAILED DESCRIPTION OF EXEMPLARY EMBODIMENTS

Figure 1:
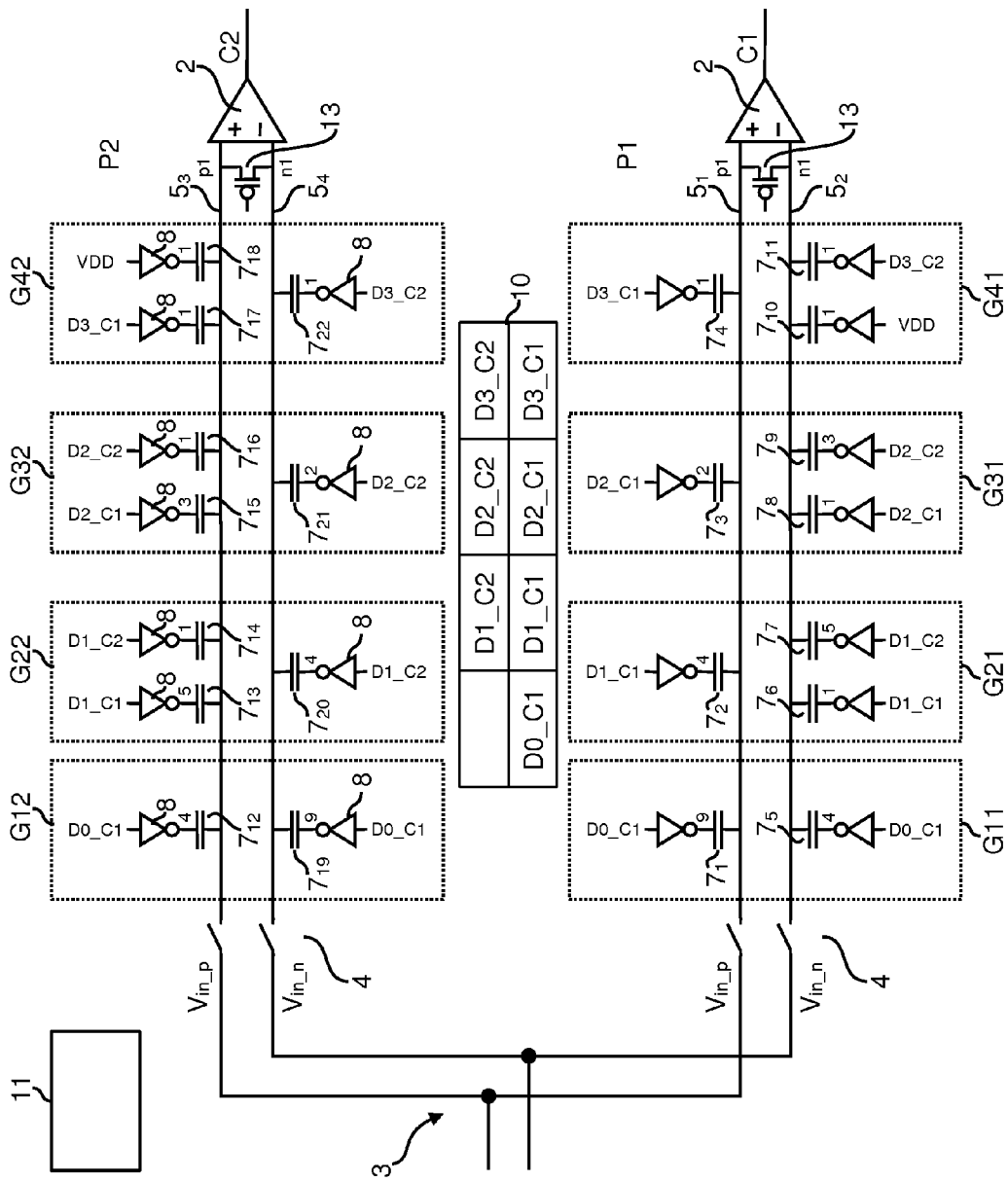
FIG. 1 shows a schematic of a ternary set-and-up redundant 5 bit analog-digital converter according to an embodiment of the present invention.

FIG. 1 shows an analog-digital converter 1 according to a first embodiment of the present invention. The analog-digital converter 1 has a topology known from SAR converters. The analog-digital converter 1 has a first and a second converter paths P1, P2, each for defining a comparison threshold for a ternary decision scheme in a comparison step.

In detail, the first converter path P1 defines an upper comparison threshold level T1 and the second converter path P2 defines a lower comparison threshold level T2 for each comparison step. Each converter path P1, P2 comprises a comparator 2 connected to respective signal lines 5 with its inverting and non-inverting input. The signal lines 5 are connectable via input switches 4 to input lines 3 carrying the input signal.

Each signal line 5 is connected to a capacitor ladder which will be described in detail below. The capacitor ladder includes a number of capacitors 7, each of which is connected with a first terminal to the respective signal line 5 and with a second terminal to a respective control switch 8 which is adapted to connect either a high reference voltage VREF_P or a low reference voltage VREF_N to the second end of the capacitor 7. The control switches 8 are switched according to result bits in a result register 10 the cells of which are directly connected to a control input of the respective control switches 8. In general, the result register 10 has a number of banks corresponding to the number of converter paths. In the present embodiment, the result register has cells for storing 2×4 bits, such that each bank of 4 bit is reserved for one of the conversion paths P1, P2. The cells for the comparison result bits are indicated as D[Cycle number]_C[converter_path_number]. The converter, i.e. all logic, input switches 4, control switches 8 and capacitors 7 can be integrated in CMOS logic.

In detail, the first converter path P1 has a first signal line $5_1$ and a second signal line $5_2$. The first signal line $5_1$ is connected to the higher potential of the input voltage, and the second signal line $5_2$ is connected to the lower potential of the input voltage. The first signal line $5_1$ is connected with a first to fourth capacitors 7 of different capacities, wherein it is preferred but not essential that the capacities are related to each other by integer factors. In the present example, a first capacitor $7_1$ has a capacitance of 9C, wherein C is a unit capacity. A second capacitor $7_2$ has a capacitance of 4C, a third capacitor $7_3$ a capacitance of 2C, and a fourth capacitor $7_4$ a capacitance of 1C. Similarly, the second signal line $5_2$ has a fifth capacitor $7_5$ having a capacitance of 4C, a sixth capacitor $7_6$ having a capacitance of 1C, a seventh capacitor $7_7$ having a capacitance of 5C, an eighth capacitor $7_8$ having a capacitance of 1C, a ninth capacitor $7_9$ having a capacitance of 3C, a tenth capacitor $7_{10}$ having a capacitance of 1C, and an eleventh capacitor $7_{11}$ having a capacitance of 1C.

Regarding the second conversion path P2, a third signal line $5_3$ and a fourth signal line $5_4$ is provided. A twelfth capacitor $7_{12}$ having a capacitance of 4C, a thirteenth capacitor $7_{13}$ having a capacitance of 5C, a fourteenth capacitor $7_{14}$ having a capacitance of 1C, a fifteenth capacitor $7_{15}$ having a capacitance of 3C, a sixteenth capacitor $7_{16}$ having a capacitance of 1C, a seventeenth capacitor $7_{17}$ having a capacitance of 1C, an eighteenth capacitor $7_{18}$ having a capacitance of 1C are connected with a third signal line $5_3$, and a nineteenth capacitor $7_{19}$ having a capacitance of 9C, a twentieth capacitor $7_{20}$ having a capacitance of 4C, a twenty-first capacitor $7_{21}$ having a capacitance of 2C, a twenty-second capacitor $7_{22}$ having a capacitance of 1C are connected with a fourth signal line $5_4$.

In general, the setting of the relative capacitances of the capacitors is a design matter and can deviate from the above values. Redundancy is provided in that the value range defined by the result bit of one previously performed comparison step is extended for one of the next comparison steps so that a conversion result can finally be obtained that is outside the value range defined by one or more of the result bits.

Each of the capacitors 7 can be connected by means of an associated control switch 8 with the high reference potential VREF_P or the low reference potential VREF_N. The control switches 8 can e.g. be built from an inverter having a serial connection of two NMOS transistors on which the high reference potential VREF_P and the low reference potential VREF_N are connected. Alternatively, one NMOS and one PMOS transistor can be used to implement the control switch 8. The control inputs of the NMOS transistors is connected to the control unit 11 to apply a control signal by which it is determined whether the high or the low reference voltage VREF_P, VREF_N is supplied by a node between the NMOS transistors of the control switch 8.

The capacitors $7_1$ to $7_{22}$ are grouped regarding the result bits by which their associated control switches 8 are controlled. So the first and the fifth capacitors $7_1$, $7_5$ form a first group G11 of the first converter path P1, the second, sixth, and seventh capacitors $7_2$, $7_6$, $7_7$ form a second group G21 of the first converter path P1, the third, eighth and ninth capacitors $7_3$, $7_8$, $7_9$ form a third group G31 of the first converter path P1, the fourth, tenth and eleventh capacitors $7_4$, $7_{10}$, $7_{11}$ form a fourth group G41 of the first converter path P1. Analogously, the twelfth and the nineteenth capacitors $7_{12}$, $7_{19}$ form a first group G12 of the second converter path P2, the thirteenth, fourteenth and twentieth capacitors $7_{13}$, $7_{14}$, $7_{20}$ form a second group G22 of the second converter path P2, the fifteenth, sixteenth and twenty-first capacitors $7_{15}$, $7_{16}$, $7_{21}$ form a third group G32 of the second converter path P2, the seventeenth, eighteenth and twenty-second capacitors $7_{17}$, $7_{18}$, $7_{22}$ form a fourth group G42 of the second converter path P2. Hence, each group of capacitors is associated to one converter path P1, P2 and to one setting step of a specific conversion cycle. Capacitors 7 are only set after the comparison step of a respective conversion cycle.

A control terminal of each of the control switches 8 is directly connected with an output of the result register 10. The result register 10 has an output for each cell in which a respective comparison result is written. The output provides a signal level which is directly applied to the respective one or more control switches 8 which are switched according to the signal corresponding to the non-inverted result bit in the cell. Furthermore, the result register 10 may provide a further inverting output for each cell which is also applied to respective one or more control switches 8 which are switched according to the signal corresponding to the inverted result bit in the cell. Conveniently, a typical CMOS differential comparator readily produces the inverted result bits. Alternatively, the output is connected via an (not shown) inverter with the respective control switch 7, which is switched according to the signal corresponding to the inverted result bit in the cell. The signal propagation through the inverter might be regarded as negligible.

The analog-digital conversion of the converter 1 is controlled by a control unit 11 which cycles through conversion steps thereby filling the cells of the result register 10 starting with the most significant bit to the least significant bit. Each conversion cycle has a comparison step in which a comparison is performed by means of the comparators, and a setting step where the comparison results are read out and stored, and the control switches 8 are switched to a switching state defined by the comparison results capacitors.

In the following, the method for performing an analog-digital conversion with the above-described analog-digital converter 1 is described. At an initial state all the second terminals of the capacitors 7 connected to the signal lines 5 are connected to one reference potential, in the present case to the lower reference potential VREF_N, by means of the control switches 8. The control switches 8 can be set according to the state of the respective result bits of result register 10 such that the control switches 8 are set by writing bits into the result register 10 before starting the conversion. Here, the cells of the result register 10 are written with "0"s or "1"s, respectively, such that the associated control switches 8 have a switching state which applies the lower reference potential VREF_N to the second terminals of the associated capacitors 7.

Equalizing switches 13 may be provided to calibrate the comparators 2 for offset voltages. When calibrating the switches 13 are closed in this state to connect the first and second signal lines $5_1$, $5_2$ and the third and fourth signal lines $5_3$, $5_4$, respectively. While all second terminals of the capacitors 7 are connected to the lower reference potential VREF_N, the input switches 4 are closed and switch 13 is opened in a next state, so that the input signal on the input lines 3 to be converted is applied to the signal lines 5 of both converter paths P1, P2, thereby charging all capacitors 7 of the capacitor ladders.

Thereafter, the input switches 4, controlled by the control unit 11, are opened again to disconnect the input lines 3 from the signal lines 5 and in a first conversion step (performed in the first conversion cycle) a comparison is performed using at least one of the converters 2 of the converter paths P1, P2. In the present embodiment, the first conversion step may be a mere binary decision and determines the most significant result bit which is written into the respective cell of the result register 10 as D0_C1. In the present case the first comparison step determines the sign of voltage of the input signal and is performed by the first converter path P1. It could also be performed by the second converter path P2.

The result bit D0_C1 of the first conversion cycle D0 influences the setting of the thresholds defined by the conversion paths P1, P2 for a next (second) conversion cycle. Depending on the result bit D0_C1 of the first comparison step it has been determined whether the voltage of the input signal tends to lie in the upper half of the conversion range or in the lower half.

In the next (second) conversion cycle D1, a ternary decision is made by defining two comparison threshold levels T1, T2 to define three value ranges. The two comparison threshold levels T1, T2 are defined by the converter paths P1, P2, respectively. The three ranges are substantially defined by a middle range between the two comparison threshold levels T1, T2, wherein an upper range is defined as the range being above an upper comparison threshold level, and a lower range is defined as the range being below a lower comparison threshold level.

In detail, depending on the comparison result D0_C1 of the first comparison, either the second terminals of both the first capacitor $7_1$ and the twelfth capacitor $7_{12}$ are connected with the upper reference potential VREF_P (D0_C1=1), or the second terminals of the fifth capacitor $7_5$ and the twentieth capacitor $7_{20}$ are connected with the lower reference potential VREF_N (D0_C1=0) thereby maintaining their switching states as initially set.

Following description refers to the case where D0_C1=0. By switching the control switches 8 associated with the first and twelfth capacitor $7_1$, $7_{12}$ to connect their second terminals with the upper reference potential VREF_P the voltage potential on the first signal line $5_1$ is increased by 9/16 (9C as the capacitance of the first capacitor $7_1$ divided by 16C which corresponds to the sum of all capacitances of the capacitors $7_1$ to $7_4$ connected to the first signal line $5_1$ in parallel) of the voltage difference between the high VREF_P and the low reference potential VREF_N, which defines the overall conversion range. Thereby, the signal voltage (which is negative as indicated by D0_C1) on the signal lines $5_1$, $5_2$ is increased and so the upper comparison level T1 for the next comparison step is set. Also the voltage potential on the third signal line $5_3$ is increased by 4/16 (4C as the capacitance of the twelfth capacitor $7_{12}$ divided by 16C which corresponds to the sum of all capacitances of the capacitors $7_{12}$ to $7_{18}$ connected to the third signal line $5_3$ in parallel) of the voltage difference between the high VREF_P and the low reference potential VREF_N. Thereby, the signal voltage on the signal lines $5_3$, $5_4$ is also increased, and so the lower threshold level T2 for the next comparison step is set. The voltage potentials on the second and fourth signal lines $5_2$, $5_4$ are not changed as the second terminals of the fifth and nineteenth capacitors $7_5$, $7_{19}$ are maintained on the lower reference potential VREF_N.

Analogously, in case of D0_C1=1, by switching the control switches 8 associated with the fifth and nineteenth capacitor $7_5$, $7_{19}$ to connect their second terminals with the upper reference potential VREF_P, the voltage potential on the second signal line $5_2$ is increased by 4/16 (4C as the capacitance of the fifth capacitor $7_5$ divided by 16C which corresponds to the sum of all capacitances of the capacitors $7_5$ to $7_{11}$ connected to the second signal line $5_2$ in parallel) of the voltage difference between the high VREF_P and the low reference potential VREF_N. Thereby, the signal voltage (which is negative as indicated by D0_C1) on the signal lines $5_1$, $5_2$ is decreased, and so the lower threshold level T2 for the next comparison step is set. Also the voltage potential on the fourth signal line $5_4$ is increased by 9/16 (9C as the capacitance of the nineteenth capacitor $7_{19}$ divided by 16C which corresponds to the sum of all capacitances of the capacitors $7_{19}$ to $7_{22}$ connected to the fourth signal line $5_4$ in parallel) of the voltage difference between the high VREF_P and the low reference potential VREF_N. Thereby, the signal voltage on the signal lines $5_3$, $5_4$ is decreased, and so the upper threshold level T1 for the next comparison step is set. The voltage potentials on the first and third signal lines $5_1$, $5_3$ are not changed as the second terminals of the first and twelfth capacitors $7_1$, $7_{12}$ are maintained on the lower reference potential VREF_N.

Figure 2:
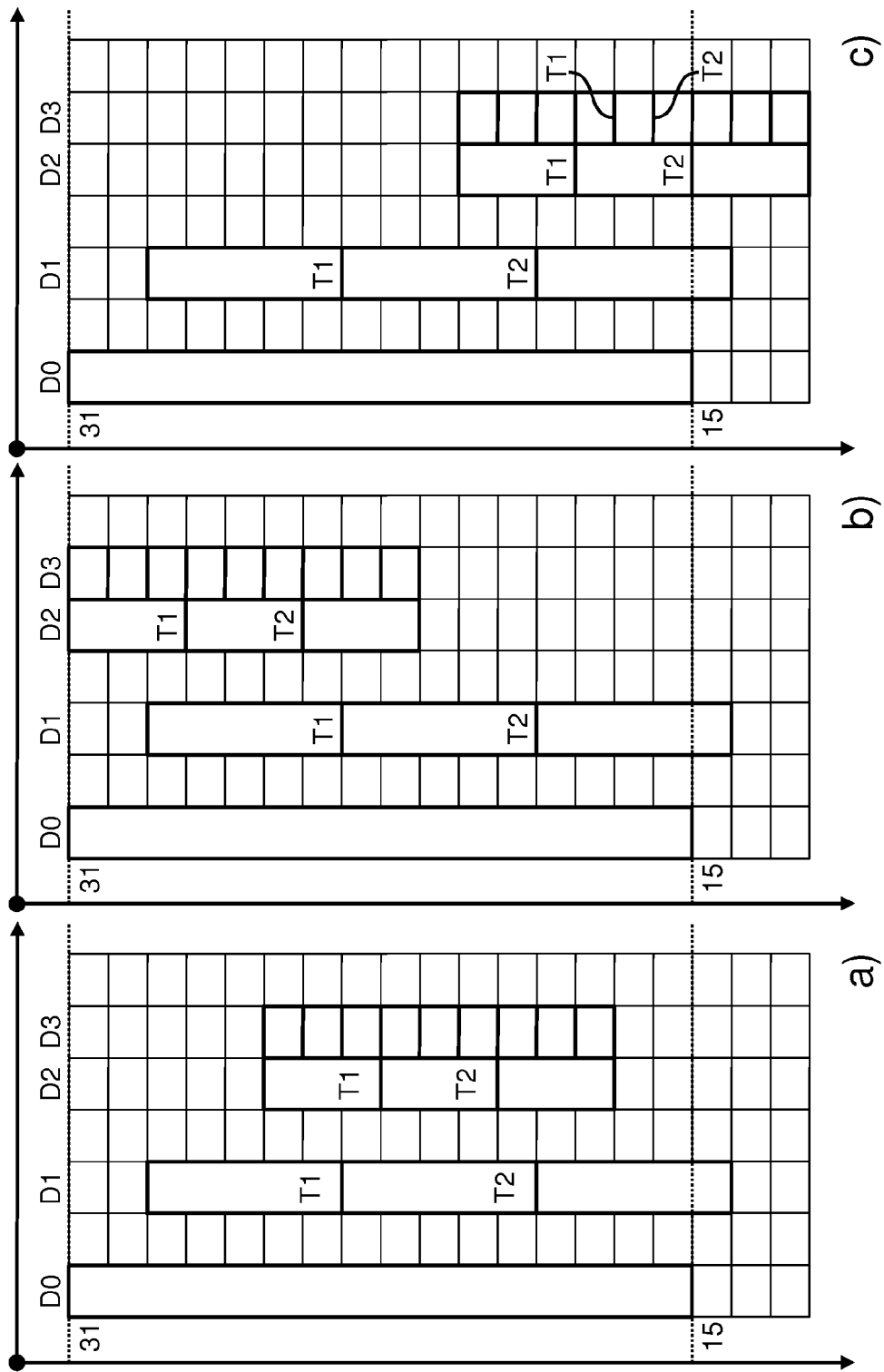
FIG. 2$a$-2$c$ shows diagram illustrating the comparison thresholds levels for each stage of the analog-digital converter of FIG. 1 for different decisions in the second conversion cycle.

The diagrams of FIGS. 2a-2c show the comparison threshold levels T1, T2 for each comparison step for a case in which the first comparison step determined that the input signal is positive, i.e. D0_C1=1. For the case that the first comparison step determined that the input signal is negative, i.e. D0_C1=0, the threshold levels are just to be mirrored at the line of value 15, i.e. values below 15 represent a negative voltage of the input signal, and values above 15 represent a positive voltage of the input signal.

FIGS. 2a-2c represents the comparison threshold levels for each of four conversion cycles of the analog-digital converter 1 of FIG. 1 wherein different decision branches for the comparison result of the second comparison steps are depicted separately for ease of illustration.

Substantially, the levels for the upper and lower comparison thresholds T1, T2 can be freely selected to define a middle range which should substantially lie within the upper or lower half of the conversion range as determined by the first comparison step.

After applying the upper reference potential VREF_P, to the respective second terminals of the respective capacitors after the first comparison step, the second comparison step is performed. The second comparison step is carried out in parallel for the first conversion path P1 and the second conversion path P2. If it is determined that in the second conversion path P2 the voltage between the third and fourth signal lines $5_3$, $5_4$ is still positive (D1_C2=1), the second terminals of the seventh capacitor $7_7$ and the twentieth capacitor $7_{20}$ are connected to the upper reference potential VREF_P and the second terminal of the fourteenth capacitor $7_{14}$ is set (maintained) to the lower reference potential VREF_N. Otherwise (D1_C2=0) the second terminals of the seventh capacitor $7_7$ and the twentieth capacitor $7_{20}$ are connected to the lower reference potential VREF_N and the second terminal of the fourteenth capacitor $7_{14}$ is maintained at the upper reference potential VREF_P.

Similarly, if it is determined that in the first conversion path P1 the voltage between the first and the second signal lines $5_1$, $5_2$ is still positive (D1_C1=1), the second terminal of the second capacitor $7_2$ is maintained at the lower reference potential VREF_N, the second terminal of the sixth capacitor $7_6$ and of the thirteenth capacitor $7_{13}$ are set to the upper reference voltage VREF_P. Otherwise (D1_C1=0) the second terminal of the second capacitor $7_2$ is connected to the upper reference potential VREF_P, the second terminal of the sixth capacitor $7_6$ and of the thirteenth capacitor $7_{13}$ are connected to the upper reference potential VREF_P.

Thereby, depending on the comparison result of the second comparison step the lower threshold level T2 set after the first comparison step is shifted from the actual state set after the first comparison step by:

−4C/16C (4C as the capacitance of the twentieth capacitor) of the full conversion range defined by the voltage difference between the upper VREF_P and lower reference potential VREF_N in the case that the second comparison step resulted in the voltage of the input signal being below the lower threshold level of the second comparison step, −1C/16C (1C as the capacitance of the fourteenth capacitor) of the full conversion range defined by the voltage difference between the upper VREF_P and lower reference potential VREF_N in the case that the second comparison step resulted in the voltage of the input signal being above the lower threshold level of the second comparison step and below the upper threshold level of the second comparison step, or −6C/16C (5C+1C/16C) (5C as the capacitance of the thirteenth capacitor plus 1C as the capacitance of the fourteenth capacitor) of the full conversion range defined by the voltage difference between the upper VREF_P and lower reference potential VREF_N in the case that the second comparison step resulted in the voltage of the input signal being above the upper threshold level of the second comparison step.

Analogously, depending on the comparison result of the second comparison step the upper threshold level set after the first comparison step is shifted from the actual state set after the first comparison step by:

−6C/16C (5C+1C/16C) (5C as the capacitance of the sixth capacitor plus 1C as the capacitance of the seventh capacitor) of the full conversion range defined by the voltage difference between the upper VREF_P and lower reference potential VREF_N in the case that the second comparison step resulted in the voltage of the input signal being below the lower threshold level of the second comparison step, −1C/16C (1C as the capacitance of the sixth capacitor) of the full conversion range defined by the voltage difference between the upper VREF_P and lower reference potential VREF_N in the case that the second comparison step resulted in the voltage of the input signal being above the lower threshold level of the second comparison step and below the upper threshold level of the second comparison step, or +4C/16C (4C as the capacitance of the second capacitor) of the full conversion range defined by the voltage difference between the upper VREF_P and lower reference potential VREF_N in the case that the second comparison step resulted in the voltage of the input signal being above the upper threshold level of the second comparison step.

The result bits of the second comparison step are maintained in the result register 10 and the states of the control switches 8 associated with the result bits in the result register 10 are maintained at the respective switching level and not changed thereafter until the full conversion is carried out.

After the voltage potentials of the second terminals of the respective capacitors 7 have been changed, a third comparison step is performed. The third comparison step is substantially similar to the second comparison step, wherein the third, eighth and fifteenth capacitors $7_3$, $7_8$, $7_{15}$ (2C, 1C, 3C) of the third group G31 of the first conversion path P1 are switched according to the comparison result of the comparator 2 of the first conversion path P1 defining the upper threshold level T1, and the ninth, sixteenth and twenty-first capacitors $7_9$, $7_{16}$, $7_{21}$ (3C, 1C, 2C) of the third group G32 of the second conversion path P2 are switched according to the comparison result of the comparator 2 of the second conversion path P2 defining the lower threshold level T2.

Finally, in a fourth conversion step only the fourth and the seventeenth capacitors $7_4$, $7_{17}$ of the fourth groups G41, G42 of both conversion paths P1, P2 are connected with the upper reference voltage VREF_P in the case of a positive result of the comparison of the first converter path P1 in the third comparison step (D3_C1=1), while the nineteenth and tenth capacitors $7_{19}$, $7_{10}$ of the fourth groups G41, G42 of both conversion paths P1, P2 are maintained at the lower reference potential VREF_N. According to the comparison result of the comparator 2 of the second converter path P2, the eleventh and twenty-second capacitors $7_{11}$, $7_{22}$ of the fourth groups G41, G42 are connected to the upper reference voltage VREF_P in case of a positive result of the comparison of the second converter path P2 in the third comparison step (D3_C2=1).

After performing all comparison steps, the final switching states can be operated to determine a digital representation of the conversion result from the result bits stored in the result register 10. This can be done by using a lookup table or a specific function related to the relations between the used capacitors 7.

The capacitances used in above embodiment sum up to 16C for each capacitor ladder, so that a transformation to a binary result can easily be performed. However, the total capacitance of one ladder can also be different from that value, in particular can be non-binary, i.e. a non $2^n$ value (n=integer value).

In the above embodiment, the resolution of such an analog-digital converter is 5 bits, which can be achieved in a total of four comparison cycles.

The values of the individual capacitors 7 are customized to shift the upper and lower comparison threshold levels to achieve a required redundancy. Redundancy may be provided from one ternary comparison step to one of the succeeding ternary comparison steps by allowing the lower threshold level T2 of one of the succeeding ternary comparison steps to be decreased until it reaches or falls below the lower threshold level T2 of the one comparison step and/or to increase the upper threshold level from one ternary comparison step to one of the succeeding ternary comparison steps by allowing the upper threshold level of the one of the succeeding ternary comparison steps to be increased until it reaches or exceeds the upper threshold level of the one comparison step.

Notably, although capacitances of the capacitance ladders are set to provide a conversion redundancy the result of the comparison steps can be directly used to switch the control switches 8 for applying the respective reference voltage VREF_N, VREF_P to the second terminals of the respective capacitors 7 such that no logic between the result register 10 and the control switches 8 is needed. Thereby, the conversion cycle time for setting the capacities can be kept as low as possible which contributes to a small overall conversion time.

Figure 3:
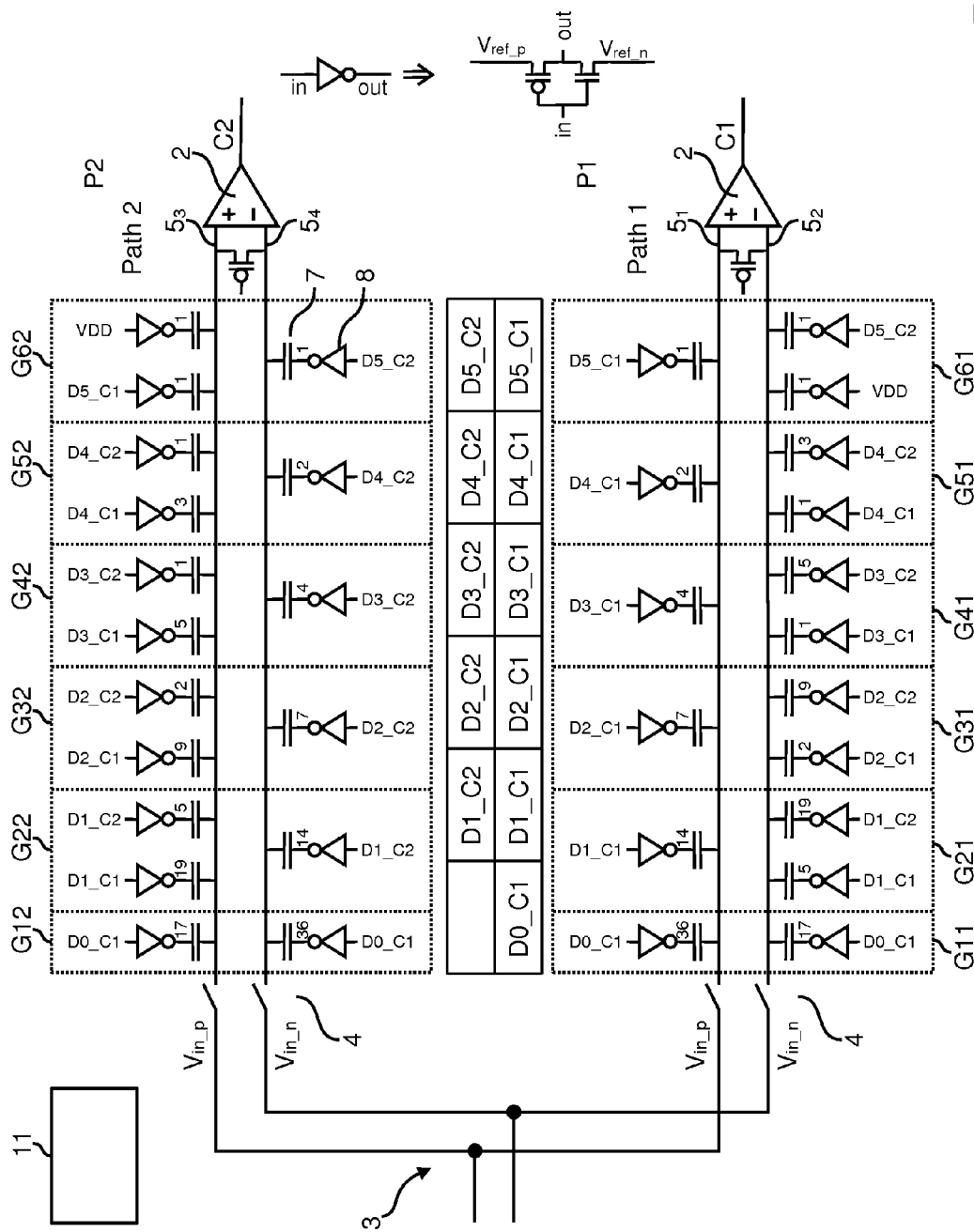
FIG. 3 shows a schematic of a ternary set-and-up redundant 7 bit analog-digital converter.

In FIG. 3 another embodiment of the present invention is shown for a 7 bit SAR analog-digital converter with redundancy. It becomes clear that the concept of defining ternary comparison stages by using two comparators in parallel can be extended to an infinite number of stages and different grades of conversion redundancy.

What is claimed is:

1. An analog-digital converter, comprising:
   a plurality of converter units each comprising:
      a comparator for performing a comparison using an input voltage;
      one or more capacitor ladders each including a signal line connected with first terminals of a plurality of capacitors and with one input of the comparator, wherein the capacitances of the capacitors are set to provide a conversion redundancy; and
      a plurality of switches each of which is associated with one of the plurality of capacitors, connected to a second terminal of the respective capacitor with a first or a second reference potential, wherein the input voltage is shifted when switching at least one of the plurality of switches; and a control unit for controlling a number of converter units, wherein the control unit is configured to set switching states of the plurality of switches in a plurality of conversion cycles and to obtain comparison results from each of the comparators in a comparison step subsequent to each setting of the switching states, wherein the comparison results for each conversion cycle are associated with the switching states of at least one of the plurality of switches, and wherein the switching states of the switches are directly controlled by a level of the comparison results for each conversion cycle.

2. The analog-digital converter according to claim 1, further comprising a storage means for storing the comparison results for each conversion cycle, wherein the storage means includes outputs for each of the comparison results, wherein each of the outputs is associated with at least one of the plurality of switches, and wherein the switching states of the switches are directly controlled by the levels of the outputs.

3. The analog-digital converter according to claim 1, wherein each of the converter units includes a pair of capacitor ladders so that two signal lines are applied to the comparator at an inverting and non-inverting input thereof.

4. The analog-digital converter according to claim 2, wherein each of the converter units includes a pair of capacitor ladders so that two signal lines are applied to the comparator at an inverting and non-inverting input thereof.

5. The analog-digital converter according to claim 1, wherein the control unit is configured to set each of the switches to an initial state, to load the capacitors by applying the input voltage to the signal line, and to cycle through the conversion cycles, and wherein the comparison results of each conversion cycle is stored in a storage means.

6. The analog-digital converter according to claim 2, wherein the control unit is configured to set each of the switches to an initial state, to load the capacitors by applying the input voltage to the signal line, and to cycle through the conversion cycles, and wherein the comparison results of each conversion cycle is stored in the storage means.

7. The analog-digital converter according to claim 3, wherein the control unit is configured to set each of the switches to an initial state, to load the capacitors by applying the input voltage to the signal line, and to cycle through the conversion cycles, and wherein the comparison results of each conversion cycle is stored in a storage means.

8. The analog-digital converter according to claim 1, wherein, for each of the converter units, the plurality of capacitors of the one or more capacitor ladders is divided into groups of capacitors, wherein each group of capacitors is associated with the comparison results of a comparison of one conversion cycle.

9. The analog-digital converter according to claim 2, wherein, for each of the converter units, the plurality of capacitors of the one or more capacitor ladders is divided into groups of capacitors, wherein each group of capacitors is associated with the comparison results of a comparison of one conversion cycle.

10. The analog-digital converter according to claim 3, wherein, for each of the converter units, the plurality of capacitors of the one or more capacitor ladders is divided into groups of capacitors, wherein each group of capacitors is associated with the comparison results of a comparison of one conversion cycle.

11. The analog-digital converter according to claim 5, wherein, for each of the converter units, the plurality of capacitors of the one or more capacitor ladders is divided into groups of capacitors, wherein each group of capacitors is associated with the comparison results of a comparison of one conversion cycle.

12. The analog-digital converter according to claim 8, wherein a number of capacitors in each group corresponds to a number of different comparison results of the comparison of the respective conversion cycle.

13. The analog-digital converter according to claim 8, wherein the capacitors of each of the groups of capacitors are connected to increase or decrease the input voltage applied at the comparator depending on the comparison results of the comparison of the respective conversion cycle.

14. The analog-digital converter according to claim 12, wherein the capacitors of each of the groups of capacitors are connected to increase or decrease the input voltage applied at the comparator depending on the comparison results of the comparison of the respective conversion cycle.

15. A method for operating an analog-digital converter, the converter including a number of converter units each including a comparator for performing a comparison using an input voltage, one or more capacitor ladders each having a signal line connected with first terminals of a plurality of capacitors and with one input of the comparator, and a plurality of switches each of which is associated with one of the plurality of capacitors, connected to a second terminal of the respective capacitor with a first or a second reference potential, the input voltage being shifted when switching one or more of the switches, the method comprising:

setting switching states of the plurality of switches in a plurality of conversion cycles;

obtaining comparison results from each of the comparators in a comparison subsequent to each setting of the switching states, or wherein the comparison results for each conversion cycle are associated with the switching states of the one or more of the plurality of switches; and directly controlling the switching states of the one or more of the plurality of switches by levels of the comparison results of a preceding conversion cycle.

16. A computer program product, comprising a program code stored in a non-transitory computer readable storage medium, the program code that when executed on a data processing unit performs the method according to claim 15.

17. The analog-digital converter according to claim 1, wherein the plurality of switches each of which comprises an inverter receiving an input based on outputs from each of the plurality of converter units.

18. The analog-digital converter according to claim 1, wherein the comparison results from the comparator of each of the plurality of converter units directly switch the plurality of switches to apply respective one of the first or second reference voltages to the second terminals of respective plurality of capacitors.

* * * * *